(12) United States Patent
Ishibashi

(10) Patent No.: US 8,471,364 B2
(45) Date of Patent: Jun. 25, 2013

(54) GROUP III NITRIDE SUBSTRATE, SEMICONDUCTOR DEVICE COMPRISING THE SAME, AND METHOD FOR PRODUCING SURFACE-TREATED GROUP III NITRIDE SUBSTRATE

(75) Inventor: Keiji Ishibashi, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 34 days.

(21) Appl. No.: 13/251,404

(22) Filed: Oct. 3, 2011

(65) Prior Publication Data

US 2012/0018736 A1 Jan. 26, 2012

Related U.S. Application Data

(60) Continuation of application No. 13/212,637, filed on Aug. 18, 2011, which is a division of application No. 12/934,319, filed as application No. PCT/JP2009/050657 on Jan. 19, 2009, now Pat. No. 8,030,681.

(30) Foreign Application Priority Data

Jan. 14, 2009 (JP) ................................. 2009-005953

(51) Int. Cl.
*H01L 21/02* (2006.01)
(52) U.S. Cl.
USPC .................................. 257/607; 257/E31.019
(58) Field of Classification Search
USPC ............................ 257/E31.019, 609, 615, 607
See application file for complete search history.

(56) References Cited

U.S. PATENT DOCUMENTS

| | | | | |
|---|---|---|---|---|
| 6,488,767 B1 * | 12/2002 | Xu et al. | ............................ | 117/2 |
| 2006/0226412 A1 * | 10/2006 | Saxler et al. | .................... | 257/11 |
| 2007/0120144 A1 * | 5/2007 | Moustakas | .................... | 257/103 |
| 2007/0196942 A1 | 8/2007 | Kitaoka et al. | | |
| 2010/0012969 A1 * | 1/2010 | Yoon et al. | ....................... | 257/99 |

FOREIGN PATENT DOCUMENTS

| | | |
|---|---|---|
| CN | 1877854 | 12/2006 |
| EP | 1717286 | 11/2006 |
| EP | 1863074 | 12/2007 |
| JP | 2599250 | 1/1997 |
| JP | 10-290051 | 10/1998 |
| JP | 11-074233 | 3/1999 |

(Continued)

OTHER PUBLICATIONS

D. Basak et al., "High Temperature Reactive Ion Etching of GaN and AlGaN Using $Cl_2$ and $CH_4$ Plasma," Extended Abstracts of the International Conference on Solid State Devices and Materials, Japan Society of Applied Physics. Tokyo, JA, Sep. 1, 1998, pp. 466-467, XP000823271.

(Continued)

*Primary Examiner* — Matthew W Such
*Assistant Examiner* — Ali Naraghi
(74) *Attorney, Agent, or Firm* — Drinker Biddle & Reath LLP

(57) ABSTRACT

A group III nitride substrate in one embodiment has a surface layer. The surface layer contains 3 at. % to 25 at. % of carbon and $5 \times 10^{10}$ atoms/cm$^2$ to $200 \times 10^{10}$ atoms/cm$^2$ of a p-type metal element. The group III nitride substrate has a stable surface.

4 Claims, 6 Drawing Sheets

FOREIGN PATENT DOCUMENTS

| | | |
|---|---|---|
| JP | 2000-182960 | 6/2000 |
| JP | 2006-310362 | 11/2006 |
| JP | 2006-344911 | 12/2006 |
| JP | 2007-299979 | 11/2007 |
| WO | 2005/041283 | 5/2005 |
| WO | 2008/047627 | 4/2008 |

OTHER PUBLICATIONS

S. J. Pearton et al., "GaN: Processing, defects, and devices," Journal of Applied Physics, American Institute of Physics. New York, US, vol. 86, No. 1, Jul. 1, 1999, pp. 1-78, XP012047854.

G. Franz et al., "Reactive ion etching of GaN and GaAs: Radially uniform processes for rectangular, smooth sidewalls," Journal of Vacuum Science and Technology: Part A, AVS/AIP, Melville, NY., US, vol. 17, No. 1, Jan. 1, 1999, pp. 56-61, XP012004372.

J.P. Zhang et al., "p-Type co-doping study of GaN by photoluminescence", Journal of Crystal Growth vol. 197 pp. 368-371, 1999.

K.T. Liu et al., "C and N co-implantation in Be-doped GaN", Semiconductor Science and Technology, vol. 20, pp. 740-744, Jun. 2005.

* cited by examiner

GROUP III NITRIDE SUBSTRATE, SEMICONDUCTOR DEVICE COMPRISING THE SAME, AND METHOD FOR PRODUCING SURFACE-TREATED GROUP III NITRIDE SUBSTRATE

This is a continuation application of copending application Ser. No. 13/212,637, having a filing date of Aug. 18, 2011, which is a divisional of prior application Ser. No. 12/934,319, having a §371 date of Sep. 24, 2010, now U.S. Pat. No. 8,030,681 which is a national stage filing based on PCT International Application No. PCT/JP2009/050657, filed on Jan. 19, 2009. The copending application Ser. Nos. 12/934,319 and 13/212,637 are incorporated by reference herein in their entireties.

TECHNICAL FIELD

The present invention relates to a group III nitride substrate, a semiconductor device having the substrate, and a method for manufacturing the substrate.

BACKGROUND ART

As a semiconductor substrate, Known semiconductor substrates described in Patent documents 1 to 5 below are known. Patent document 1 discloses a semiconductor substrate that is subjected to a surface treatment so as to obtain desired electric characteristics. Specifically, Patent document 1 discloses a p-type compound semiconductor substrate having p-type impurity atoms in the surface thereof, an n-type compound semiconductor substrate having n-type impurity atoms in the surface thereof, a semi-insulating compound semiconductor substrate having Fe atoms or C atoms in the surface thereof, and a compound semiconductor substrate of a first conductivity type having impurities of a second conductivity type in the surface thereof.

Patent document 2 discloses that metal contamination on a GaN substrate surface is set to be no greater than $10 \times 10^{10}$ atoms/cm$^2$. Patent document 3 discloses that the number of Si atoms is set to be $3 \times 10^{13}$ atoms/cm$^2$, and the number of atoms of an acidic substance is set to be $3 \times 10^{14}$ atoms/cm$^2$, on the surface of a group III nitride substrate, in order to achieve good epitaxial growth on the substrate. Patent document 4 discloses that an surface roughness of Al$_x$Ga$_y$In$_z$N (0<y≦1, x+y+z=1) is set to be 0.15 nm by CMP, to obtain a substrate free of defects and contamination. Patent document 4 also discloses that Al$_2$O$_3$ or SiO$_2$ is used, as an abrasive grain, in the above CMP, and that the pH is adjusted through addition of an oxidizing agent to a polishing solution. Patent document 5 discloses a feature of using a Si-based gas and a Si piece in dry etching of a gallium nitride compound semiconductor.

Citation List

Patent Literature

Patent Literature 1: Japanese Patent Application Laid-Open No. 2006-344911
Patent Literature 2: WO 2005/041283
Patent Literature 3: WO 2008/047627
Patent Literature 4: U.S. Pat. No. 6,488,767
Patent Literature 5: Japanese Patent No. 2599250

SUMMARY OF INVENTION

Technical Problem

The quality of an epitaxially grown layer that is formed on the surface of a nitride substrate is degraded if the surface is oxidized. As a result, the performance of the device that uses the substrate drops. Moreover, epitaxial layers are grown while being matched to the lattice of the substrate surface, and hence, the crystal quality of the substrate surface must be high. There is thus a demand for nitride substrates having a stable surface.

It is an object of the present invention to provide a group III nitride substrate having a stable surface. It is a further object of the present invention to provide a semiconductor device having such a group III nitride substrate. It is yet a further object of the present invention to provide a method for manufacturing such a group III nitride substrate, i.e. a surface-treated group III nitride substrate.

Solution to Problem

The group III nitride substrate of one aspect of the present invention has a surface layer. The surface layer contains carbon of 3 at. % to 25 at. % and a p-type metal element of $5 \times 10^{10}$ atoms/cm$^2$ to $200 \times 10^{10}$ atoms/cm$^2$. This group III nitride substrate has a stable surface. Preferably, the surface layer further contains an insulating metal element of $1 \times 10^{10}$ atoms/cm$^2$ to $100 \times 10^{10}$ atoms/cm$^2$.

The semiconductor device of another aspect of the present invention comprises a group III nitride substrate having such a surface layer, and at least one epitaxially grown layer formed on the surface layer of the substrate. The surface of the group III nitride substrate in such a semiconductor device is stable, and hence the semiconductor device has good device characteristics and can be manufactured in a stable manner.

The compound semiconductor substrate of another aspect of the present invention is a group III nitride substrate with an epitaxial layer. The compound semiconductor substrate comprises the group III nitride substrate and an epitaxial layer. Preferably, the number of C atoms per 1 cm$^3$ at the interface between the group III nitride substrate and the epitaxial layer ranges from $2 \times 10^{16}$ to $5 \times 10^{17}$, and the number of atoms of the p-type metal element per 1 cm$^3$ ranges from $2 \times 10^{16}$ to $1 \times 10^{17}$. More preferably, the number of C atoms per 1 cm$^3$ at the interface ranges from $5 \times 10^{16}$ to $2 \times 10^{17}$.

In the compound semiconductor substrate of the one aspect of the present invention, the number of O atoms per 1 cm$^3$ at the interface between the group III nitride substrate and the epitaxial layer ranges preferably from $2 \times 10^{16}$ to $1 \times 10^{18}$, more preferably from $5 \times 10^{16}$ to $5 \times 10^{17}$.

In the compound semiconductor substrate of the one aspect of the present invention, the number of Si atoms per 1 cm$^3$ at the interface between the group III nitride substrate and the epitaxial layer ranges preferably from $1 \times 10^{15}$ to $1 \times 10^{19}$, more preferably from $1 \times 10^{15}$ to $5 \times 10^{18}$.

In another aspect, the present invention comprises (a) dry etching a surface of a substrate; and (b) polishing the surface of the substrate. In the dry etching, the surface of the group III nitride substrate is dry-etched in a chamber, using a mixed gas. The mixed gas is a mixture of a first gas containing carbon and a second gas containing chlorine. The dry etching is carried out in such a manner that a pressure P (Pa), a flow rate Q (sccm) of the mixed gas, and a chamber volume V (l: liters) satisfy $0.05 \leq PV/Q \leq 3.0$. In the polishing, there is used a solution containing an oxide of a p-type metal element and having a viscosity ranging from 2 (mPa·s) to 30 (mPa·s). This manufacturing method allows suitably manufacturing a group III nitride substrate having a surface layer that contains carbon of 3 at. % to 25 at. % and a p-type metal element of $5 \times 10^{10}$ atoms/cm$^2$ to $200 \times 10^{10}$ atoms/cm$^2$.

Advantageous Effects of Invention

As explained above, in the present invention there is provided a group III nitride substrate having a stable surface, and a semiconductor device comprising such a group III nitride substrate. In the present invention there is also provided a method for manufacturing such a group III nitride substrate.

REFERENCE SIGNS LIST

Figure 1:
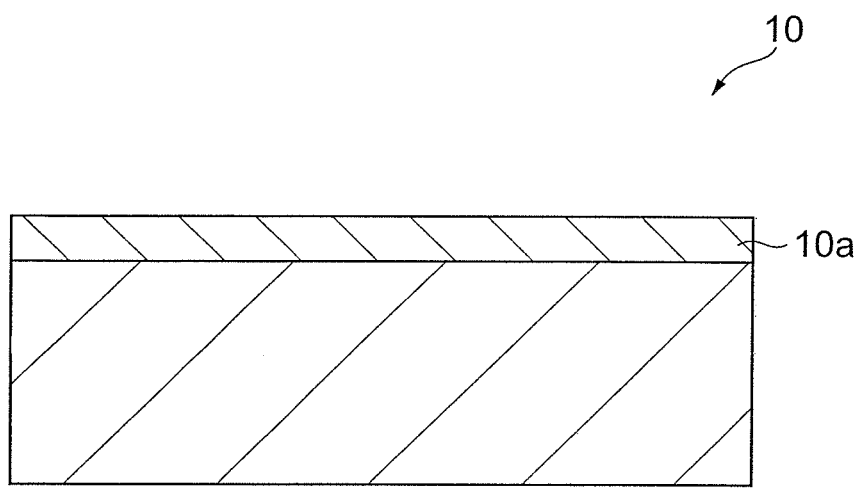
FIG. 1 is a cross-sectional view illustrating a group III nitride substrate according to an embodiment of the present invention.

1: HEMT device, 2: LED, 10: group III nitride substrate (GaN substrate), 10a: surface layer, 12: GaN layer, 14: AlGaN layer, 16: gate electrode, 18: source electrode, 20: drain electrode, 22: buffer layer, 24: first clad layer, 26: active layer, 28: second clad layer, 30: contact layer, 32: first electrode, 34: second electrode, 50: dry etching apparatus, 52: chamber, 54: upper electrode, 56: lower electrode, 58: substrate support, 60: gas supply port, 62: gas exhaust port, 64: RF power source, 70: polishing apparatus, 72: turntable, 74: polishing pad, 76: crystal holder, 78: weight, 80: slurry liquid supply port.

DESCRIPTION OF EMBODIMENTS

Preferred embodiments of the present invention are described below with reference to accompanying drawings. In the drawings, identical or equivalent portions are denoted with the same reference symbols.

FIG. 1 is a cross-sectional view of a group III nitride substrate according to an embodiment of the present invention. An example is described below in which a GaN substrate is the group III nitride substrate, but the group III nitride substrate of the present invention is not limited to a GaN substrate.

The GaN substrate 10 shown in FIG. 1 comprises a surface layer 10a. The surface layer 10a comprises carbon of 3 at. % to 25 at. %, and comprises a p-type metal element of $5 \times 10^{10}$ atoms/cm$^2$ to $200 \times 10^{10}$ atoms/cm$^2$.

Electric resistance in the surface layer 10a can be preserved thanks to the 3 at. % or more of carbon contained therein. By comprising 25 at. % or less of carbon, the electric resistance of the surface layer 10a is preserved while making it possible to achieve a high-quality epitaxially grown layer that is formed thereon.

Examples of the p-type metal element include, for instance, Cu and Zn. The surface layer 10a may comprise either Cu or Zn, or both. The resistance of the surface layer 10a can be preserved thanks to the $5 \times 10^{10}$ atoms/cm$^2$ or more of a p-type metal element contained therein. By containing $200 \times 10^{10}$ atoms/cm$^2$ or less of the p-type metal element, the electric resistance of the surface layer 10a is preserved while making it possible to achieve a high-quality epitaxially grown layer that is formed thereon.

The surface layer 10a may further comprise an insulating metal element of $1 \times 10^{10}$ atoms/cm$^2$ to $100 \times 10^{10}$ atoms/cm$^2$. Examples of the insulating metal element include, for instance, Fe and Ni. The surface layer 10a may comprise either Fe or Ni, or both. The surface of the surface layer 10a can be made more stable thanks to the presence of the insulating metal element.

A low electric resistance layer is formed on a group III nitride substrate through surface oxidation or adhesion of Si from an atmosphere. The inventors of the present application have found that the amount of oxygen and Si in the surface of the group III nitride substrate must be small in order to prevent formation of a low electric resistance layer. The oxygen concentration in the surface layer is preferably 3 at. % to 15 at. %, more preferably 5 at. % to 10 at. %. The Si concentration in the surface layer is preferably $500 \times 10^{10}$ atoms/cm$^2$ to $8000 \times 10^{10}$ atoms/cm$^2$, more preferably $1000 \times 10^{10}$ atoms/cm$^2$ to $5000 \times 10^{10}$ atoms/cm. A surface layer having an oxygen concentration and Si concentration such as the above is realized by way of the surface layer 10a of the present embodiment.

The surface roughness of the surface layer 10a of the GaN substrate 10 must be no greater than 3 nm in terms of RMS. The surface roughness is preferably no greater than 1 nm, and ranges, more preferably, from 0.1 nm to 0.5 nm. The surface roughness is measured by AFM taking an area 10 μm square as a reference surface area. An epitaxial layer of good morphology and crystallinity can be formed on the GaN substrate by setting the surface roughness to be no greater than 3 nm. The thickness of the work affected layer in the surface of the GaN substrate 10 must be no greater than 50 nm. The thickness is preferably no greater than 20 nm, and ranges, more preferably, from 1 nm to 10 nm. The work affected layer is a layer having a disarranged crystalline lattice and that forms on the surface region of the crystal, through grinding or polishing of the crystal surface. The work affected layer is observed by TEM observation of cross sections of the crystal that are cut along cleavage planes. The presence and thickness of the work affected layer is measured by comparing a surface region influenced by work versus an inner region not influenced by work. An epitaxial layer of good morphology and crystallinity can be formed on the GaN substrate by setting the thickness of the work affected layer to be no greater than 50 nm.

Figure 2:
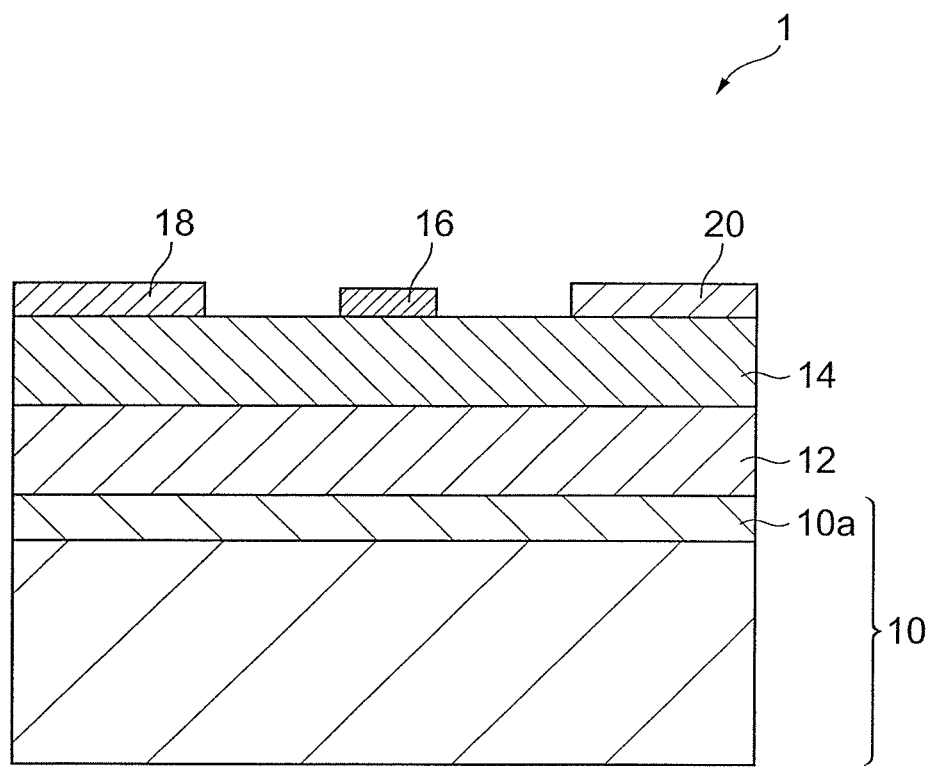
FIG. 2 shows an example of a semiconductor device comprising a group III nitride substrate according to an embodiment of the present invention.

Next, a semiconductor device according to an embodiment of the present invention is described. FIG. 2 shows an example of a semiconductor substrate comprising a group III nitride substrate according to an embodiment of the present invention. An HEMT device 1 shown in FIG. 2 comprises the above-described GaN substrate 10 and one or more epitaxial layers formed on the surface layer 10a of the GaN substrate 10. That is, the HEMT device 1 is provided with a compound semiconductor substrate that comprises the GaN substrate 10 and epitaxial layers.

Specifically, the HEMT device 1 may comprise the GaN substrate 10, a GaN layer 12, an AlGaN layer 14, a gate electrode 16, a source electrode 18 and a drain electrode 20.

In the HEMT device 1, the GaN substrate 10 is an insulating GaN substrate. The GaN layer 12 and the AlGaN layer 14 are formed, in this order, on the surface layer 10a. Both the GaN layer 12 and the AlGaN layer 14 are undoped. The gate electrode 16, the source electrode 18 and the drain electrode 20 are formed on the AlGaN layer 14. The gate electrode 16 is provided between the source electrode 18 and the drain electrode 20.

In the HEMT device 1, high electric resistance can be maintained at the surface layer 10a, and hence there is little leakage electric current. The HEMT device 1 is manufactured using the GaN substrate 10 having the stable surface layer 10a, and can therefore be manufactured in a stable manner.

Figure 3:
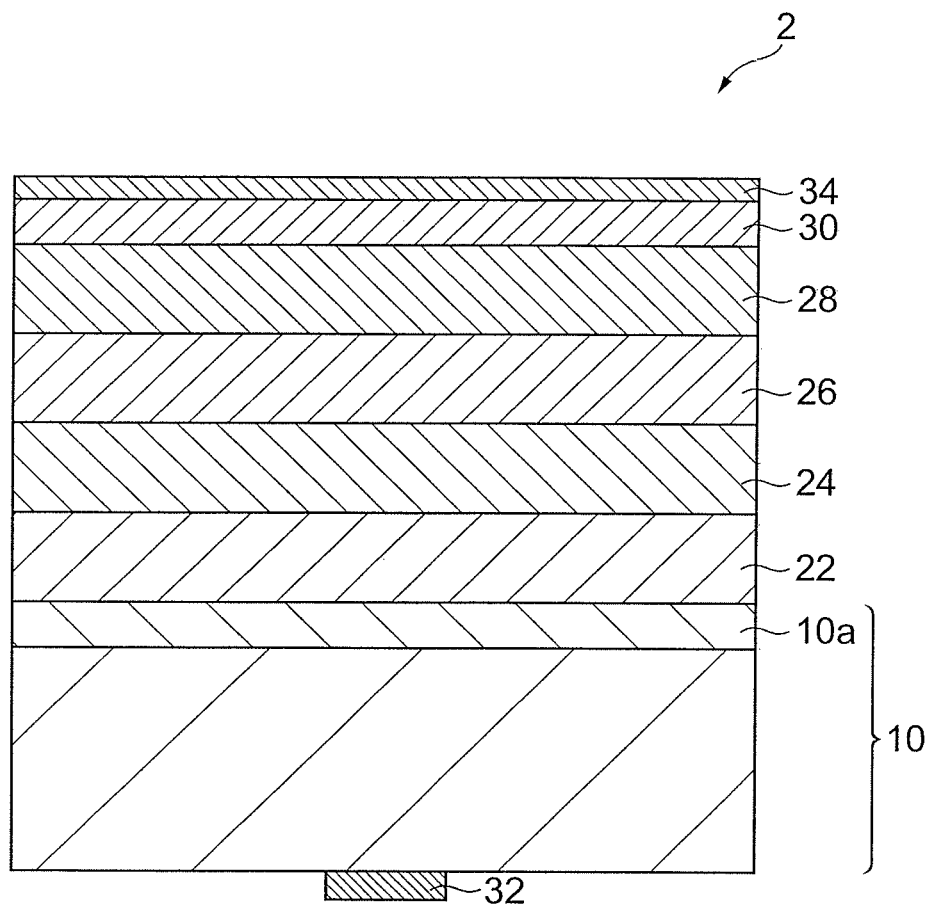
FIG. 3 shows another example of a semiconductor device comprising a group III nitride substrate according to an embodiment of the present invention.

FIG. 3 shows another example of a semiconductor device comprising a group III nitride substrate according to an embodiment of the present invention. An LED 2 shown in FIG. 3 comprises the above-described GaN substrate 10, and one or more epitaxial layers formed on the surface layer 10a of the GaN substrate 10.

Specifically, the LED 2 may comprise the GaN substrate 10, a buffer layer 22, a first clad layer 24, an active layer 26, a second clad layer 28, a contact layer 30, a first electrode 32 and a second electrode 34.

In the LED 2, the GaN substrate 10 may be an n-type GaN substrate. The buffer layer 22 may be an n-type GaN layer that is formed on the surface layer 10a. The buffer layer 22 may comprise Si as a dopant. The first clad layer 24 may be an n-type AlGaN layer that is formed on the buffer layer 22. The first clad layer 24 may comprise Si as a dopant.

The active layer 26 is formed on the first clad layer 24. An active layer having a multiple quantum well structure obtained, for instance, by alternately forming GaN barrier layers and GaInN well layers, may be used in the active layer 26.

The second clad layer 28 is formed on the active layer 26. The second clad layer 28 may be a p-type AlGaN layer that may comprise Mg as a dopant. The contact layer 30 is formed on the second clad layer 28. The contact layer 30 may be a p-type GaN layer that may comprise Mg as a dopant.

In the LED 2, the first electrode 32 is formed on the GaN substrate 10, on the opposite side of the surface layer 10a. The second electrode 34 is formed on the contact layer 30.

Such an LED 2 uses the GaN substrate 10 having the above-described surface layer 10a. Hence, the LED 2 has a large light output and can be manufactured stably.

Figure 4:
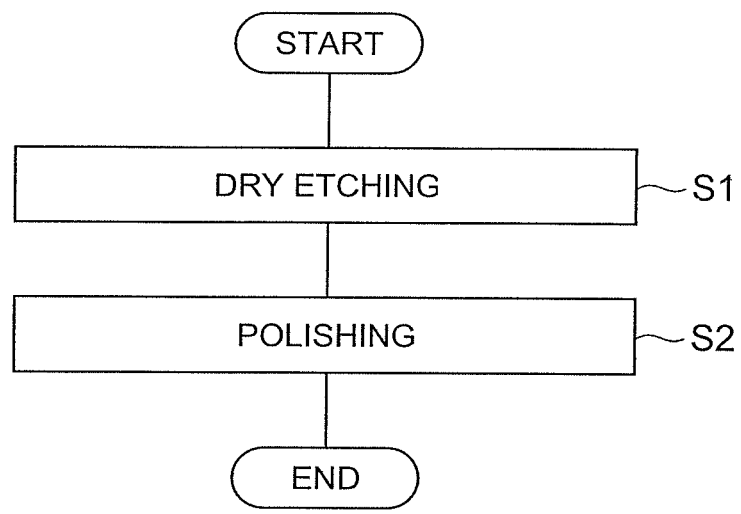
FIG. 4 is a flow diagram of a method for manufacturing a surface-treated group III nitride substrate according to an embodiment of the present invention.

In the following, a method for manufacturing the group III nitride substrate according to an embodiment of the present invention is described. FIG. 4 is a flow-diagram of a method for manufacturing a surface-treated group III nitride substrate according to an embodiment of the present invention. The manufacturing method illustrated in FIG. 4 allows suitably obtaining the above-described surface layer 10a.

In the case of a GaN crystal, the crystal of the group III nitride substrate that is subjected to the surface treatment shown in FIG. 4 may be grown by HVPE, a flux method or an ammonothermal method. In the case of an AlN crystal, the crystal may be grown by HVPE or by sublimation method. The grown crystal may be subjected to peripheral processing, to obtain a nitride crystal ingot. The group III nitride substrate may be obtained through slicing of the ingot. Slicing may be carried out using a wire saw or a blade saw. Mechanical processing such as grinding, lapping or the like may be performed in order to planarize the substrate. The hard abrasive grain used for lapping may be, for instance, diamond, SiC, BN, $Al_2O_3$, $Cr_2O_3$ or the like, which are selected based on their mechanical effect. An abrasive grain of high hardness and large particle size is used for increasing rates. An abrasive grain of low hardness and small particle size is used in order to smoothen surface roughness and reduce the work affected layer. Multi-stage polishing, in which large-particle abrasive grain gives way to a fine abrasive grain, may be used to shorten the polishing time and to obtain a smooth surface. A surface finishing process may be carried out to reduce roughness and remove the work affected layer. Surface finishing may be carried out by chemical-mechanical polishing (CMP) after mechanical polishing. The work affected layer may also be removed by dry etching.

Figure 5:
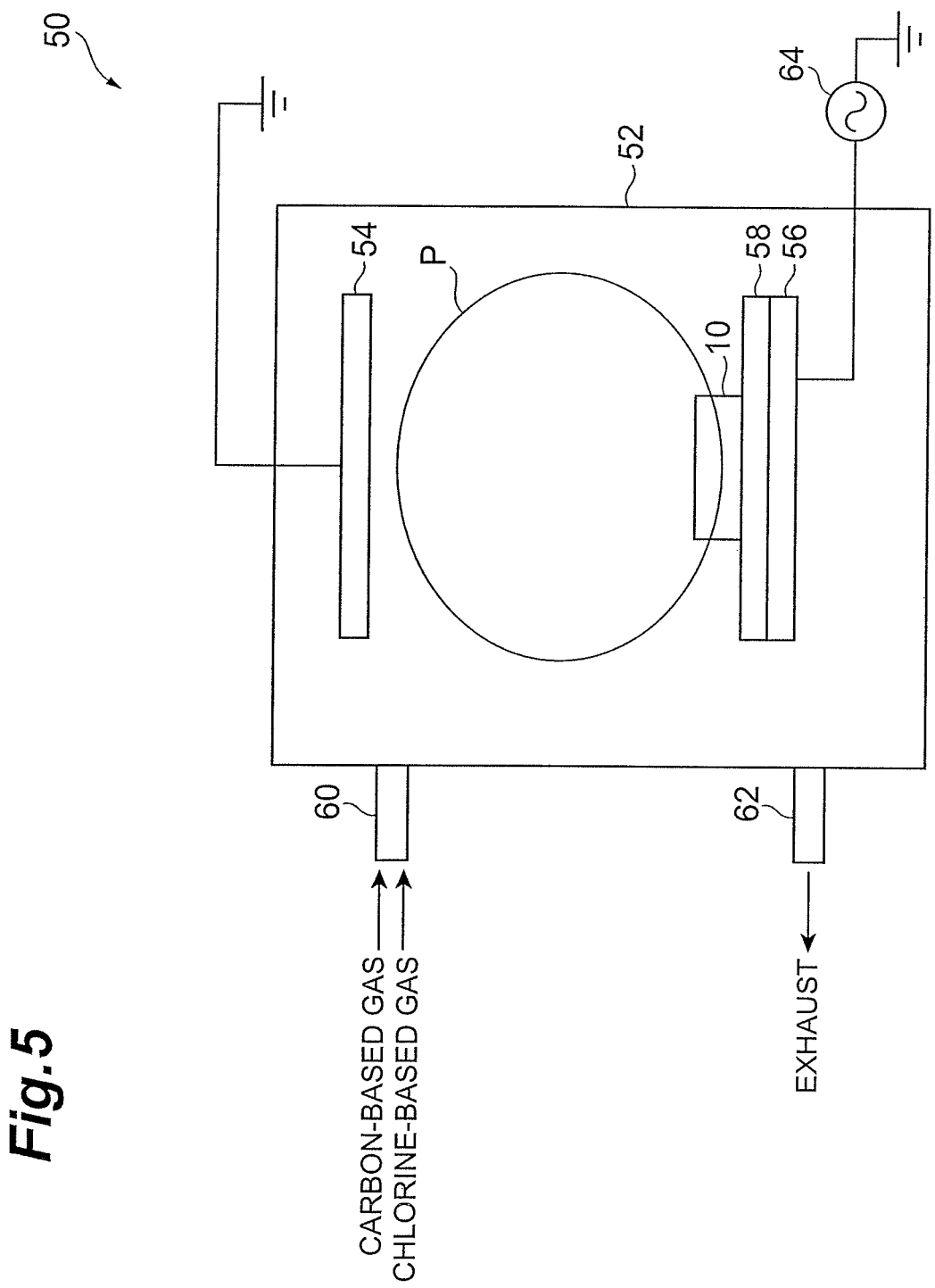
FIG. 5 shows an apparatus that can be used in a dry etching process.

Returning to FIG. 4, the manufacturing method shown in FIG. 4 comprises a dry etching step S1 and a polishing step S2. In the dry etching step S1, the surface of the group III nitride substrate is dry-etched. In the dry etching step S1, there can be used, for instance, the dry etching apparatus shown in FIG. 5. The dry etching apparatus shown in FIG. 5 is an RIE (reactive ion etching) apparatus, but the dry etching that can be used in the dry etching step of the present invention is not limited to RIE, and may be, for instance, inductively coupled plasma RIE (ICP-RIE), ECR (electron cyclotron resonance)-RIE, CAIBE (chemically-assisted ion beam etching) or RIBE (reactive-ion beam etching).

The dry etching apparatus 50 comprises a chamber 52. An upper electrode 54, a lower electrode 56 and a substrate support 58 are provided in the chamber 52. A gas supply port 60, connected to a gas source, and a gas exhaust port 62, connected to a vacuum pump, are also provided in the chamber 52.

In the dry etching apparatus 50, the group III nitride substrate 10 is placed on the substrate support 58, gas is supplied through the gas supply port 60, and high-frequency electric power is supplied to the lower electrode 56 by a RF power source 64, as a result of which plasma can be generated within the chamber 52. The dry etching apparatus 50 can dry-etch thereby the surface of the group III nitride substrate 10.

In the dry etching step Si of the present manufacturing method, a mixed gas that comprises a first gas comprising carbon (carbon-based gas) and a second gas (chlorine-based gas) comprising chlorine is supplied into the chamber 52. Examples of the carbon-based gas include, for instance, methane, ethane, propane and acetylene. Examples of the chlorine-based gas include chlorine, $BCl_3$ and $SiCl_4$.

The dry etching step S1 is carried out in such a manner that the pressure P (Pa) in the chamber, the flow rate Q of the mixed gas (sccm) and the volume V (l: liters) of the chamber satisfy:

$$0.05 \leq PV/Q \leq 3.0 \quad (1)$$

A suitable carbon concentration can be achieved in the above-described surface layer 10a by satisfying the conditions of equation (1). Herein, 1 sccm is $1.667 \times 10^{-8}$ m³/s.

Including both a Si-based gas and a Si piece in the chamber 52, in the dry etching step S1, is effective for obtaining a planar surface layer 10a. However, an excessive ratio of Si results in an increased amount of Si adhered to the substrate surface after dry etching, which is problematic. Therefore, a compound comprising Si and at least one element selected from the group consisting of C and N, such as SiC, Si3N4, $Si_{6-z}Al_zO_zN_{8-z}$, or the like, may be included in the chamber 52 in the dry etching step S1. The above compounds may be included in the chamber 52 by manufacturing the substrate support 58 using the compound, or by arranging the compound on the substrate support 58 and in the vicinity of the substrate 10. Thereby it becomes possible to obtain a planar surface layer 10a and to suppress adhesion of Si onto the surface layer 10a.

The polishing step S2 of the present manufacturing method is carried out next. The polishing step S2 is carried out, for instance, using a polishing apparatus 70 shown in FIG. 6. The polishing apparatus 70 comprises a turntable 72, a polishing pad 74, a crystal holder 76, a weight 78 and a slurry liquid supply port 80.

The polishing pad 74 is placed on the turntable 72. The turntable 72 and the polishing pad 74 can rotate about a central axis X1 of the turntable 72. The crystal holder 76 is a component for supporting the substrate 10 at the bottom face thereof. A load is exerted on the substrate 10 by the weight 78. The crystal holder 76 has a central axis X2 that is substantially parallel to the axis X1, at a position offset from the axis X1, such that the crystal holder 76 can rotate about the central axis X2. The slurry liquid supply port 80 supplies a slurry S onto the polishing pad 74.

In the polishing apparatus 70, the surface layer 10a of the substrate 10 can be polished by causing the turntable 72 and the polishing pad 74 to rotate, causing the crystal holder 76 to rotate, supplying the slurry S onto the polishing pad 74, and bringing the surface layer 10a of the substrate 10 into contact with the polishing pad 74.

In the polishing step S2 of the present manufacturing method, a solution comprising an oxide of a p-type metal element is used as the slurry S. For instance, one of CuO and ZnO, or both, can be used as the oxide of a p-type metal element. The viscosity of the solution ranges from 2 (mPa·s) to 30 (mPa·s). The viscosity of the solution can be adjusted by adding an organic compound of high viscosity, for instance ethylene glycol, or an inorganic compound such as boehmite.

In the polishing step S2, the p-type metal element can be bonded to the surface layer 10a of the substrate 10 thanks to the mechanochemical effect of the oxide. The concentration of p-type metal element in the surface layer 10a of the substrate 10 can be controlled so as to lie within a range from $5 \times 10^{10}$ atoms/cm$^2$ to $200 \times 10^{10}$ atoms/cm$^2$, by using a solution having the above viscosity.

Preferably, a non-polar solvent is used as the solvent in the solution, in order to enhance the mechanochemical effect of the metal oxide. Examples of non-polar solvents include hydrocarbons, carbon tetrachloride and diethyl ether. Using a non-polar solvent allows accelerating reactions by promoting solid contact between the metal oxide and the substrate, and makes it possible to control more efficiently the metal composition in the substrate surface.

EXAMPLES

The present invention will be explained in further detail below by way of examples of a group III nitride substrate manufactured in accordance with the method for manufacturing a group III nitride substrate according to the present invention, and of a semiconductor device manufactured on the basis of the group III nitride substrate according to the present invention. The present invention, however, is not limited to the below-described examples.

Manufacture of a GaN Substrate

A GaN substrate was manufactured in accordance with the manufacturing method of the above embodiment. Firstly, an insulating-type GaN substrate (dopant: Fe) grown by HVPE was sliced along a plane parallel to the (0001) plane, to yield a GaN substrate having 50 mm diameter×0.5 mm thickness.

The c plane ((000-1) plane) of the GaN substrate (nitride crystal), on the N-atom plane side, was bonded to a ceramic-made crystal holder by way of a wax. A turntable having a 380 mm diameter was placed in a lapping apparatus, the turntable was caused to rotate about the central axis thereof while supplying onto the turntable, through a slurry supply port, of a slurry in which diamond abrasive grain was dispersed, and the GaN substrate was caused to rotate about the central axis of the crystal holder, while the GaN substrate was pressed against the turntable with the weight placed on the crystal holder, to lap thereby the surface of the GaN crystal (c plane on the Ga atom plane side, (0001) plane).

A copper turntable and a tin turntable were used as turntables. There were prepared three types of diamond abrasive grain, having an abrasive grain size of 9 μm, 3 μm and 2 μm. The size of the abrasive grit was reduced stepwise as lapping progressed. The polishing pressure was set to 100 g/cm$^2$ to 500 g/cm$^2$. The rotational frequency of the GaN substrate and the turntable were set to 30 turns/min to 60 turns/min, both for the turntable and the crystal holder. The surface of the GaN crystal substrate became a mirror surface as a result of the above lapping.

Next, the lapped GaN substrate was subjected to chemical-mechanical polishing (CMP). Specifically, a polishing pad was arranged on a turntable having a diameter of 380 mm that was set in a polishing apparatus. The polishing pad was caused to rotate about the central axis thereof while supplying, onto the polishing pad, of a slurry in which diamond abrasive grain was dispersed, through the slurry liquid supply port. At the same time, the GaN substrate was caused to rotate about the central axis of the crystal holder while the GaN substrate was pressed against the polishing pad with the weight placed on the crystal holder. The surface of the GaN substrate (c plane on the Ga atom plane side, (0001) plane) was subjected thereby to chemical-mechanical polishing (CMP). The slurry was prepared by dispersing $Al_2O_3$ particles having a particle size of 2 μm, as an abrasive grain, in water, to a content of $Al_2O_3$ of 5 mass %, and by adjusting the pH to 2 to 4 through the addition of $HNO_3$ as a pH adjusting agent. A polyurethane suede pad was used as the polishing pad, and a stainless steel turntable was used as the turntable. The polishing pressure was set to 50 g/cm$^2$ to 600 g/cm$^2$, and the rotational frequency of the GaN substrate and the polishing pad were both set to 30 turns/min to 70 turns/min.

Next, the GaN substrate having undergone CMP was subjected to dry etching in an ICP-RIE apparatus in accordance with the above-described dry etching step S1, using a carbon-containing gas and a chlorine-containing gas. A mixed gas of methane (carbon-based gas) and chlorine (chlorine-based gas) was used in the etching gas. The volume V of the chamber, the pressure P in the chamber, the flow rate Q of the mixed gas, PV/Q, the flow rate ratio between carbon-based gas and chlorine-based gas, bias power, antenna power and the material of the substrate support were as in Examples 1 to 10 given in Table 1. These parameters were as in Comparative examples (C. ex.) 1 to 2 for reference, as given in Table 1.

The carbon concentration in the surface of the GaN substrates obtained as a result of the above process was quantified by Auger electron spectroscopy (AES). The carbon concentration in the GaN substrates of the examples and comparative examples was as given in Table 1. In Examples 1 to 10, where PV/Q ranged from 0.05 to 3.0, the carbon concentration in the surface layer of the GaN substrates was 3 at. % to 25 at. %, regardless of the flow ratio between the carbon-based gas and the chlorine-based gas. When PV/Q was smaller than 0.05 (Comparative example 1), the carbon concentration in the surface layer of the GaN substrate was smaller than 3 at. %, and when PV/Q was greater than 3 (Comparative example 2), the carbon concentration in the surface layer of the GaN substrate was greater than 25 at. %. The carbon concentration in the surface layer was not affected by the etching time ordinarily used in the surface treatment. The carbon concentration in the surface layer was not affected within ranges of bias power from 50 W to 200 W and of antenna power from 100 to 400 W.

TABLE 1

| | C. ex. 1 | Ex. 1 | Ex. 2 | Ex. 3 | Ex. 4 | Ex. 5 | Ex. 6 | Ex. 7 | Ex. 8 | Ex. 9 | Ex. 10 | C. ex. 2 |
|---|---|---|---|---|---|---|---|---|---|---|---|---|
| Chamber volume V (l) | 15 | 15 | 35 | 35 | 35 | 35 | 50 | 35 | 35 | 35 | 35 | 50 |
| Pressure P in chamber (Pa) | 0.3 | 0.3 | 0.3 | 0.3 | 0.3 | 0.3 | 0.3 | 0.3 | 0.3 | 0.3 | 0.3 | 0.3 |
| Mixed gas flow rate Q (sccm) | 150 | 90 | 105 | 21 | 10.5 | 5.25 | 5 | 5.25 | 5.25 | 5.25 | 5.25 | 3.75 |
| PV/Q (Pa·l/sccm) | 0.03 | 0.05 | 0.1 | 0.5 | 1 | 2 | 3 | 2 | 2 | 2 | 2 | 4 |
| Flow ratio (carbon-based gas:chlorine-based gas) | 1:1 | 1:1 | 1:1 | 1:1 | 1:1 | 1:1 | 1:1 | 1:9 | 3:7 | 7:3 | 9:1 | 1:1 |
| Bias power (W) | 80 | 80 | 80 | 80 | 80 | 80 | 80 | 80 | 80 | 80 | 80 | 80 |
| Antenna power (W) | 300 | 300 | 300 | 300 | 300 | 300 | 300 | 300 | 300 | 300 | 300 | 300 |
| Substrate support material | SiC | SiC | SiC | SiC | $Si_3N_4$ | $Si_3N_4$ | SiC | SiC | SiC | SiC | SiC | $Si_3N_4$ |
| C concentration (at. %) | 1 | 3 | 5 | 8 | 14 | 20 | 25 | 7 | 10 | 16 | 18 | 35 |
| Substrate surface roughness RMS (nm) | 1 | 1 | 1 | 1 | 1 | 1 | 1 | 1.5 | 1.2 | 0.8 | 0.7 | 1 |
| Thickness of work affected layer in substrate (nm) | 20 | 20 | 20 | 20 | 20 | 20 | 20 | 20 | 20 | 20 | 20 | 20 |

Figure 6:
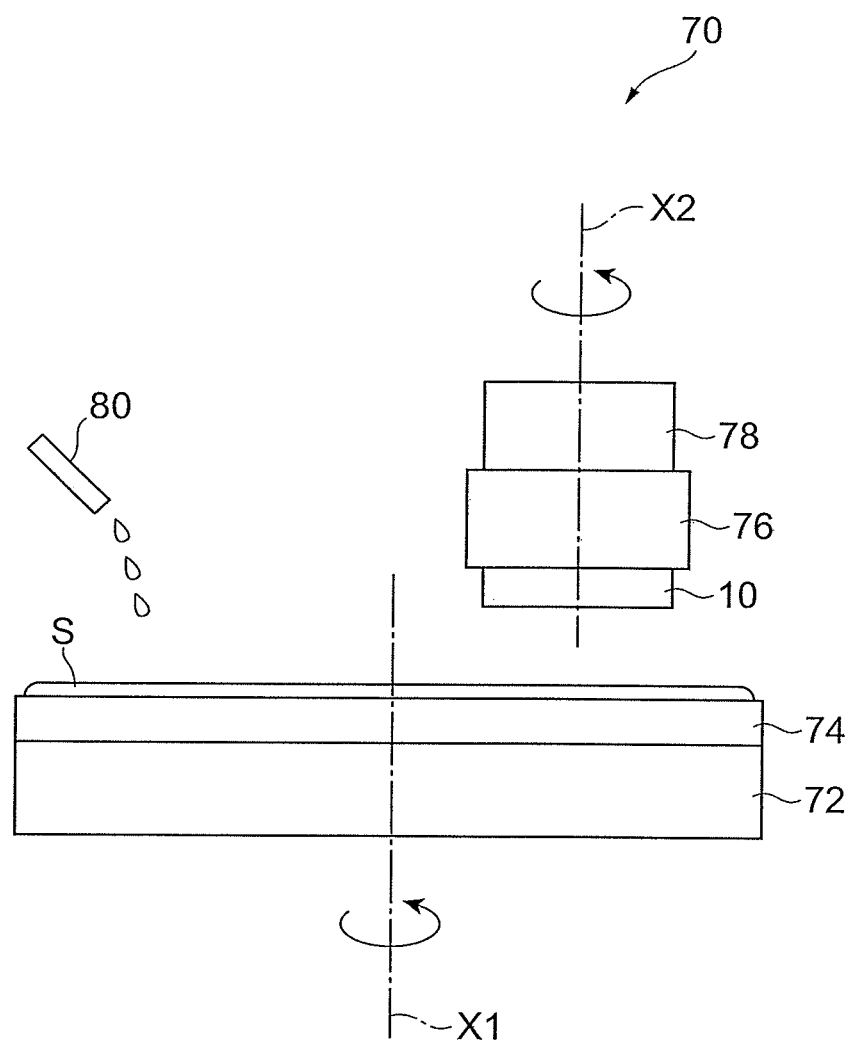
FIG. 6 shows an apparatus that can be used in a polishing process.

Next, the surface layer of the GaN substrates after dry etching was polished with a solution containing an oxide of a p-type metal element, using a polishing apparatus identical to that of the above-described CMP, i.e. the polishing apparatus illustrated in FIG. 6. Specifically, the surface layer of the GaN substrates after dry etching was polished according to the parameters of Examples 11 to 21 in Table 2. That is, GaN substrates were polished using a solution comprising the metal oxides and solvents of Examples 11 to 21 in Table 2, and having the viscosities of Examples 11 to 21 in Table 2, under application of the pressures onto the GaN substrates of Examples 11 to 21 in Table 2, and at the rotational frequency of the turntable and crystal holder of Examples 11 to 21 in Table 2. For reference, GaN substrates were polished using solutions comprising the metal oxides and solvents of Comparative examples (C. ex.) 3 to 4 in Table 2, and having the viscosities of Comparative examples 3 to 4 in Table 2, under application of pressures onto the GaN substrates of Comparative examples 3 to 4 in Table 2, and at the rotational frequency of the turntable and crystal holder of Comparative examples 3 to 4 in Table 2. A non-woven pad (compressibility 3.0%) was used in the polishing pad, and a surface-treated aluminum turntable was used as the turntable.

The concentration of p-type metal element in the surface of the GaN substrates obtained in the above process was quantified by total-reflection X-ray fluorescence. The Cu concentration and Zn concentration in the examples and comparative examples were as given in Table 2. As apparent from the sum value of the Cu concentration and the Zn concentration in Table 2, by employing a solution comprising an oxide of a p-type metal element and having a viscosity ranging from 2 (mPa·s) to 30 (mPa·s), the concentration of p-type metal element in the surface layer of the GaN substrates in Examples 11 to 21 could be kept within a range from $5 \times 10^{10}$ atoms/cm² to $200 \times 10^{10}$ atoms/cm², independently from the pressure during polishing and the revolutions of the turntable and the crystal holder. By contrast, when the viscosity of the solution was smaller than 2 (mPa·s) (Comparative example 3), the concentration of the p-type metal element was greater than $200 \times 10^{10}$ atoms/cm², and when the viscosity of the solution was greater than 30 (mPa·s) (Comparative example 4), the concentration of the p-type metal element was smaller than $5 \times 10^{10}$ atoms/cm². A large particle size of the abrasive grain in the polishing solution tended to result in increased surface roughness and a thicker work affected layer. A small particle size in the abrasive grain elicited a weak surface modification effect. Therefore, the particle size of the abrasive grain ranged preferably from 50 nm to 2000 nm, more preferably from 200 nm to 1000 nm. The concentration of p-type metal element in the surface of the GaN substrates was unaffected within such a range of abrasive grain particle size. A high concentration of abrasive grain in the solution was accompanied by increased surface roughness and a thicker work affected layer. A low concentration of abrasive grain elicited a weak surface modification effect. Therefore, the concentration of abrasive grain ranged preferably from 1 wt % to 10 wt %, more preferably from 2 wt % to 5 wt %. The concentration of p-type metal element in the surface of the GaN substrates was unaffected within such a range of abrasive grain concentration. A small compressibility of the polishing pad tended to result in increased surface roughness and a thicker work affected layer. A large compressibility elicited a weak surface modification effect. Therefore, the compressibility of the polishing pad ranged preferably from 1% to 20%, more preferably from 3% to 15%. The concentration of p-type metal element in the surface of the GaN substrates was unaffected within such a range of polishing pad compressibility. The concentration of p-type metal element in the surface of the GaN substrates was unaffected by a polishing time of 3 minutes to 30 minutes ordinarily used in surface treatments.

tion and lift-off. Ti/Al/Ti/Au (20/100/20/300 nm) was used in the electrodes. Lift-off was followed by an alloying thermal treatment at 600° C. for 1 minute. Next, a gate electrode was formed in accordance with the same process as in the formation of the source electrode and the drain electrode. Ni/Au (50/500 nm) was used in the gate electrode. The gate length was 2

For reference, GaN substrates having a surface layer with a carbon concentration and p-type metal element concentration

TABLE 2

| | C. ex. 3 | Ex. 11 | Ex. 12 | Ex. 13 | Ex. 14 | Ex. 15 | Ex. 16 | Ex. 17 | Ex. 18 | Ex. 19 | C. ex. 4 | Ex. 20 | Ex. 21 |
|---|---|---|---|---|---|---|---|---|---|---|---|---|---|
| Metal oxide | CuO ZnO | CuO ZnO | CuO ZnO | CuO ZnO | CuO ZnO | CuO ZnO | CuO ZnO | CuO ZnO | CuO ZnO | CuO ZnO | CuO ZnO | CuO ZnO | CuO ZnO |
| Solvent | Water | Water | Water | Water | Water | Water | Water | Water | Water | Water | Water | Cyclohexane | Cyclohexane |
| Viscosity (mPa·s) | 0.5 | 2 | 5 | 10 | 20 | 30 | 10 | 10 | 10 | 10 | 50 | 20 | 20 |
| Pressure (g/cm$^2$) | 150 | 150 | 150 | 150 | 150 | 150 | 150 | 150 | 50 | 800 | 150 | 150 | 50 |
| Rotational frequency (rpm) | 40 | 40 | 30 | 50 | 40 | 40 | 10 | 80 | 40 | 40 | 40 | 40 | 40 |
| Cu concentration ($\times 10^{10}$ atoms/cm$^2$) | 350 | 120 | 50 | 30 | 6 | 3 | 60 | 8 | 6 | 70 | 1 | 60 | 5 |
| Zn concentration ($\times 10^{10}$ atoms/cm$^2$) | 200 | 80 | 50 | 20 | 4 | 2 | 50 | 6 | 4 | 50 | 0 | 40 | 5 |
| Substrate surface roughness RMS (nm) | 0.45 | 0.45 | 0.45 | 0.45 | 0.45 | 0.45 | 0.45 | 0.45 | 0.45 | 0.45 | 0.45 | 0.45 | 0.1 |
| Thickness of work affected layer in substrate (nm) | 8 | 8 | 8 | 8 | 8 | 8 | 8 | 8 | 4 | 11 | 8 | 8 | 1 |

Evaluation of a HEMT Device

HEMT devices of the above-described embodiment were manufactured using the GaN substrate of the above-described embodiment. For each of the examples, 200 HEMT devices were prepared. Specifically, for the HEMT devices of Examples 22 to 28, there were firstly prepared insulating GaN substrates (resistivity $1\times 10^7$ Ω·cm) having a surface layer with a carbon concentration and a concentration of a p-type metal element (Cu and Zn) as given in the columns of Examples 22 to 28 in Table 3.

The GaN substrates were placed in a reactor of an OMVPE apparatus. Then a gas comprising hydrogen, nitrogen and ammonia was fed into the reactor, and the GaN substrates were thermally treated at a temperature of 1100° C. for 20 minutes.

The temperature of the GaN substrates was next raised to 1130° C., and ammonia and Trimethylgallium (TMG) were fed into the reactor, to grow thereby a 1.5 GaN layer on the GaN substrates. Next, Trimethylaluminium (TMA), TMG and ammonia were fed into the reactor, to grow an AlGaN layer, 30 nm thick and having an Al composition of 20%, on the GaN layer.

Next, a source electrode and a drain electrode were formed on the AlGaN layer by photolithography, EB vapor deposias given the columns of Comparative examples (C. ex.) 5 to 10 in Table 3 were prepared for HEMT devices of Comparative examples 5 to 10, and HEMT devices were manufactured in the same way. For each of the comparative examples, 200 HEMT devices were prepared.

The HEMT devices thus obtained were tested for gate leakage current. A condition was set whereby HEMT devices having a gate current density of $1\times 10^{-6}$ A/cm$^2$ upon application of a 5 V gate voltage were deemed to be HEMT devices having good device characteristics. The yields of HEMT devices that satisfied the above condition in the examples and comparative examples were as given in Table 3. The yield of HEMT devices in Examples 22 to 28, which were the HEMT devices utilized a GaN substrate having a surface layer comprising carbon of 3 at. % to 25 at. % and comprising a p-type metal element of $5\times 10^{10}$ atoms/cm$^2$ to $200\times 10^{10}$ atoms/cm$^2$, was equal to or greater than 65%. By contrast, the yield of the HEMT devices in Comparative examples 5 to 10 was significantly lower than 65%. The RMS surface roughness of the substrates was 1.5 nm, both in the examples and comparative examples. The work affected layer was 30 nm, both in the examples and comparative examples.

TABLE 3

| | C. ex. 5 | C. ex. 6 | C. ex. 7 | Ex. 22 | Ex. 23 | Ex. 24 | Ex. 25 | Ex. 26 | Ex. 27 | Ex. 28 | C. ex. 8 | C. ex. 9 | C. ex. 10 |
|---|---|---|---|---|---|---|---|---|---|---|---|---|---|
| C concentration (at. %) | 1 | 3 | 1 | 3 | 5 | 9 | 20 | 25 | 3 | 25 | 25 | 40 | 40 |
| Cu concentration ($\times 10^{10}$ atoms/cm$^2$) | 2 | 0 | 3 | 3 | 6 | 20 | 65 | 120 | 110 | 3 | 320 | 140 | 380 |
| Zn concentration ($\times 10^{10}$ atoms/cm$^2$) | 0 | 2 | 2 | 2 | 4 | 10 | 35 | 80 | 90 | 2 | 230 | 60 | 230 |
| Yield (%) | 38 | 47 | 52 | 69 | 75 | 88 | 78 | 72 | 70 | 71 | 51 | 48 | 35 |

The composition of the interface between the group III nitride substrate and the epitaxially grown layer in the HEMT devices of Example 22, Example 24, Example 26, Comparative example 5 and Comparative example 10, i.e., the composition of the interface between the group III nitride substrate and the epitaxially grown layer in compound semiconductor substrates, was examined by SIMS analysis. The results were as follows.

In Example 22, the number of C atoms per 1 cm$^3$ was $2\times10^{16}$, the number of atoms of p-type metal element per 1 cm$^3$ was $2\times10^{16}$, the number of O atoms per 1 cm$^3$ was $1\times10^{18}$, and the number of Si atoms per 1 cm$^3$ was $1\times10^{19}$.

In Example 24, the number of C atoms per 1 cm$^3$ was $1\times10^{17}$, the number of atoms of p-type metal element per 1 cm$^3$ was $5\times10^{16}$, the number of O atoms per 1 cm$^3$ was $1\times10^{17}$, and the number of Si atoms per 1 cm$^3$ was $5\times10^{17}$.

In Example 26, the number of C atoms per 1 cm$^3$ was $5\times10^{17}$, the number of atoms of p-type metal element per 1 cm$^3$ was $1\times10^{17}$, the number of O atoms per 1 cm$^3$ was $2\times10^{16}$, and the number of Si atoms per 1 cm$^3$ was $2\times10^{17}$.

In Comparative example 5, the number of C atoms per 1 cm$^3$ was $2\times10^{15}$, the number of atoms of p-type metal element per 1 cm$^3$ was $2\times10^{16}$, the number of O atoms per 1 cm$^3$ was $1\times10^{19}$, and the number of Si atoms per 1 cm$^3$ was $1\times10^{20}$.

In Comparative example 10, the number of C atoms per 1 cm$^3$ was $5\times10^{18}$, the number of atoms of p-type metal element per 1 cm$^3$ was $1\times10^{18}$, the number of O atoms per 1 cm$^3$ was $1\times10^{16}$ and the number of Si atoms per 1 cm$^3$ was $2\times10^{17}$.

Thus, good HEMT device yields were obtained in Examples 22, and 26 where the interface composition in the compound semiconductor substrate was good. By contrast, the HEMT device yield dropped in the case of an interface composition in the compound semiconductor substrate as in Comparative examples 5 and 10.

Next, for HEMT devices of Examples 29 to 36, there were prepared insulating GaN substrates (resistivity $1\times10^7 \Omega\cdot$cm) having a surface layer with a carbon concentration, a concentration of p-type metal element (Cu), and a concentration of insulating metal element (Fe) as given in the columns of Examples 29 to 36 in Table 4. Using these GaN substrates, HEMT devices were manufactured in the same way as in Examples 22 to 28. For each of the examples, there were prepared 200 HEMT devices. For reference, there were prepared, for HEMT devices of Comparative examples (C. ex.) 11 to 15, insulating GaN substrates (resistivity $1\times10^7 \Omega\cdot$cm) having a surface layer with a carbon concentration, a concentration of p-type metal element (Cu), and a concentration of insulating metal element (Fe) as given the columns of Comparative examples 11 to 15 in Table 4. The HEMT devices were manufactured in the same way as above. For each of the comparative examples, there were prepared 200 HEMT devices. The yield of the HEMT devices in Examples 29 to 36 and Comparative example 11 to 15 was determined under the same conditions as in Examples 22 to 28 and Comparative examples 5 to 10 described above. As shown in Table 4, the yield of the HEMT devices was further increased through the presence of an insulating metal element of $1\times10^{10}$ atoms/cm$^2$ to $100\times10^{10}$ atoms/cm$^2$ in the surface layer of the GaN substrates. The surface roughness RMS of the substrates was 2.2 nm both in the examples and comparative examples. The work affected layer was 40 nm both in the examples and comparative examples.

TABLE 4

| | C. ex. 11 | C. ex. 12 | Ex. 29 | Ex. 30 | Ex. 31 | Ex. 32 | Ex. 33 | Ex. 34 | Ex. 35 | Ex. 36 | C. ex. 13 | C. ex. 14 | C. ex. 15 |
|---|---|---|---|---|---|---|---|---|---|---|---|---|---|
| C concentration (at. %) | 7 | 7 | 7 | 7 | 7 | 7 | 7 | 7 | 7 | 7 | 7 | 7 | 7 |
| Cu concentration ($\times 10^{10}$ atoms/cm$^2$) | 1 | 1 | 5 | 5 | 10 | 48 | 100 | 200 | 5 | 200 | 380 | 200 | 360 |
| Fe concentration ($\times 10^{10}$ atoms/cm$^2$) | 0 | 1 | 0 | 1 | 2 | 12 | 20 | 100 | 100 | 1 | 100 | 250 | 230 |
| Yield (%) | 45 | 69 | 73 | 94 | 95 | 98 | 96 | 94 | 70 | 72 | 75 | 70 | 42 |

LED Evaluation

LEDs of the above-described embodiment were manufactured using the GaN substrate of the above-described embodiment. For each of the examples, there were prepared 200 LEDs. Specifically, an n-type GaN substrate having a resistivity of $1\times10^{-2}\Omega\cdot cm$ and a carrier density of $3\times10^{18}/cm^2$ was used for LEDs of Examples 37 to 43. As the n-type GaN substrates in the examples, there were prepared n-type GaN substrates having a surface layer with a carbon concentration and a concentration of p-type metal element (Cu and Zn) as given in the columns of Examples 37 to 43 in Table 5.

The n-type GaN substrates were placed in an MOCVD apparatus, and there were sequentially formed by MOCVD, on the side of one main plane ((0001) plane) of the n-type GaN substrates, a 1 μm-thick n-type GaN layer (dopant: Si), a 150 nm-thick n-type $Al_{0.1}Ga_{0.9}N$ layer (dopant: Si), an active layer, a 20 nm-thick p-type $Al_{0.2}Ga_{0.8}N$ layer (dopant: Mg), and a 150 nm-thick p-type GaN layer (dopant: Mg), to obtain thereby epitaxially grown layers. The active layer had a multiple quantum well structure in which four 10 nm-thick barrier layers, formed with a GaN layer, were alternately stacked with three 3 nm-thick well layers, formed with a $Ga_{0.85}In_{0.15}N$ layer.

For reference, n-type GaN substrates having a resistivity of $1\times10^{-2}\Omega\cdot cm$ and a carrier density of $3\times10^{18}/cm^3$, and having a surface layer with a carbon concentration and concentration of a p-type metal element (Cu and Zn) as given the columns of Comparative examples (C. ex.) 16 to 21 in Table 5, were prepared for LEDs of Comparative examples 16 to 21. For each of the comparative examples, there were prepared 200 LEDs. Epitaxially grown layers was obtained in Comparative examples 16 to 21 in the same way as in Examples 37 to 43.

The PL intensity of the epitaxially grown layers thus obtained was evaluated by a photoluminescence (PL) method. In PL intensity evaluation, there was evaluated the emission intensity at a wavelength of 460 nm upon excitation through irradiation, onto a sample, of laser light, using an He—Cd laser having a wavelength of 325 nm as an excitation light source. The results were as given in Table 5.

Next, a multilayer structure, formed with a 200 nm-thick Ti layer, a 1000 nm-thick Al layer, a 200 nm-thick Ti layer and a 2000 nm-thick Au layer, was formed, as a first electrode, on the side of the other main plane ((000-1) plane) of the n-type GaN crystal substrates in Examples 37 to 43 and Comparative examples 16 to 21, with heating in a nitrogen atmosphere, to form an n-electrode having a diameter of 100 μm. A multilayer structure, formed with a 4 nm-thick Ni layer and a 4 nm-thick Au layer, was formed, as a second electrode, on the p-type GaN layer, with heating in an inert gas atmosphere, to form a p-side electrode. The products resulting from the above process were machined to 2 mm square, to yield the LEDs of Examples 37 to 43 and Comparative examples 16 to 21.

The light output of the LEDs thus obtained was measured under conditions of an injection current of 4 A, using an integrating sphere. The light output of the light-emitting elements was measured as follows. A predetermined current was injected into the light-emitting element placed in the integrating sphere, and light output was measured by a detector receiving light condensed from the light-emitting element. The yield of the LEDs of Examples 37 to 43 and Comparative examples 16 to 21 was determined under a condition where a LED having a light output of 2 W or greater was deemed to be LEDs having good characteristics. The results were as given in Table 5.

As shown in Table 5, the LEDs in Examples 37 to 43, i.e. LEDs that used a GaN substrate having the surface layer that contained carbon of 3 at. % to 25 at. % and a p-type metal element of $5\times10^{10}$ atoms/$cm^2$ to $200\times10^{10}$ atoms/$cm^2$, exhibited clearly superior PL intensity and yield in comparison with the LEDs of Comparative examples 16 to 21. The surface roughness RMS of the substrates was 0.9 nm both in the examples and comparative examples. The work affected layer was 20 nm both in the examples and comparative examples.

TABLE 5

| | C. ex. 16 | C. ex. 17 | C. ex. 18 | Ex. 37 | Ex. 38 | Ex. 39 | Ex. 40 | Ex. 41 | Ex. 42 | Ex. 43 | C. ex. 19 | C. ex. 20 | C. ex. 21 |
|---|---|---|---|---|---|---|---|---|---|---|---|---|---|
| C concentration (at. %) | 1.5 | 3 | 1.5 | 3 | 5 | 9 | 20 | 25 | 3 | 25 | 25 | 35 | 35 |
| Cu concentration ($\times10^{10}$ atoms/$cm^2$) | 1 | 1 | 2 | 2 | 5 | 12 | 40 | 90 | 80 | 2 | 250 | 80 | 230 |
| Zn concentration ($\times10^{10}$ atoms/$cm^2$) | 1 | 1 | 3 | 3 | 5 | 18 | 60 | 110 | 120 | 3 | 300 | 120 | 400 |
| PL intensity (a.u.) | 0.52 | 0.58 | 0.62 | 0.89 | 0.95 | 1 | 0.92 | 0.87 | 0.9 | 0.88 | 0.6 | 0.55 | 0.49 |
| Yield (%) | 36 | 48 | 51 | 78 | 88 | 93 | 85 | 76 | 79 | 77 | 48 | 43 | 34 |

INDUSTRIAL APPLICABILITY

As explained above, in the present invention there is provided a group III nitride substrate having a stable surface, and a semiconductor device comprising such a group III nitride substrate. In the present invention, there is also provided a method for manufacturing such a group III nitride substrate.

The invention claimed is:

1. A semiconductor device comprising: a group III nitride substrate comprising a surface layer,
    wherein the surface layer contains carbon of 3 at. % to 25 at. % and a p-type metal element of $5\times10^{10}$ atoms/$cm^2$ to $200\times10^{10}$ atoms/$cm^2$, and
    wherein the group III nitride substrate is an n-Type GaN substrate.

2. The semiconductor device according to claim 1, wherein the semiconductor device comprises an LED.

3. A semiconductor device comprising: a group III nitride substrate comprising a surface layer,
    wherein the surface layer contains carbon of 3 at. % to 25 at. % and a p-type metal element of $5\times10^{10}$ atoms/$cm^2$ to $200\times10^{10}$ atoms/$cm^2$, and wherein the group III nitride substrate is an insulating GaN substrate.

4. The semiconductor device according to claim 3, wherein the semiconductor device comprises a HEMT device.

* * * * *